US008599031B2

(12) United States Patent
Gelbien et al.

(10) Patent No.: US 8,599,031 B2
(45) Date of Patent: Dec. 3, 2013

(54) SYSTEMS AND METHODS FOR STRAY VOLTAGE DETECTION

(75) Inventors: Lawrence J. Gelbien, Needham, MA (US); Werner J. Schweiger, Franklin, MA (US); Philip B. Andreas, Braintree, MA (US)

(73) Assignee: NSTAR Electric Company, Westwood, MA (US)

( * ) Notice: Subject to any disclaimer, the term of this patent is extended or adjusted under 35 U.S.C. 154(b) by 444 days.

(21) Appl. No.: 12/947,318

(22) Filed: Nov. 16, 2010

(65) Prior Publication Data
US 2011/0221602 A1    Sep. 15, 2011

Related U.S. Application Data

(63) Continuation-in-part of application No. 12/080,071, filed on Mar. 31, 2008, now abandoned.

(60) Provisional application No. 60/921,175, filed on Mar. 30, 2007.

(51) Int. Cl.
*G08B 21/00*  (2006.01)
*G01R 31/00*  (2006.01)
*G01R 31/302*  (2006.01)

(52) U.S. Cl.
USPC ........... 340/662; 340/660; 340/657; 340/635; 324/754.2; 324/754.27

(58) Field of Classification Search
None
See application file for complete search history.

(56) References Cited

U.S. PATENT DOCUMENTS

| 3,641,430 | A |   | 2/1972  | Williams |
|-----------|---|---|---------|----------|
| 4,547,761 | A |   | 10/1985 | Jones |
| 4,814,933 | A | * | 3/1989  | Filter et al. ...................... 361/86 |
| 4,816,956 | A |   | 3/1989  | Hertz et al. |
| 4,959,792 | A |   | 9/1990  | Sullivan |
| 4,983,954 | A |   | 1/1991  | Huston |

(Continued)

FOREIGN PATENT DOCUMENTS

WO    WO-2006/106538    10/2006

OTHER PUBLICATIONS

Didik, F. J. Electrified Cover Safeguard. Retrieved from www.manholesafety.com on May 19, 2009.

(Continued)

*Primary Examiner* — Julie Lieu
(74) *Attorney, Agent, or Firm* — Ropes & Gray LLP

(57) ABSTRACT

A system for detecting stray voltage in a conductive object is disclosed herein. The system includes a pick-up element, electrical circuitry, a housing for enclosing the circuitry, a support for mounting the housing, and an indicator. The pick-up element is separated from the conductive object and capable of detecting an electric field from the conductive object. The support of the housing is such that the pick-up element remains separated from the conductive object. The electrical circuitry determines a voltage level corresponding to the electric field detected by the pick-up element and generates, based on a comparison of the determined voltage level relative to a reference voltage level, an indicator signal representative of whether stray voltage is present in the conductive object. Based on the indicator signal, the indicator indicates to a user of the system whether stray voltage is present in the conductive object.

25 Claims, 5 Drawing Sheets

(56) References Cited

U.S. PATENT DOCUMENTS

| | | | |
|---|---|---|---|
| 5,065,142 A * | 11/1991 | Green | 340/660 |
| 5,153,565 A | 10/1992 | Schweitzer, Jr. | |
| 5,281,810 A | 1/1994 | Fooks et al. | |
| 5,461,369 A | 10/1995 | Campbell et al. | |
| 5,668,870 A | 9/1997 | Dahlquist | |
| 6,229,446 B1 | 5/2001 | Lloyd-Jones et al. | |
| 6,329,924 B1 * | 12/2001 | McNulty | 340/660 |
| 7,248,054 B2 | 7/2007 | Kalokitis et al. | |
| 7,253,642 B2 | 8/2007 | Kalokitis et al. | |
| 7,283,055 B2 * | 10/2007 | Didik | 340/573.1 |
| 7,388,509 B2 | 6/2008 | Burrow | |
| 7,449,892 B2 * | 11/2008 | Wiswell et al. | 324/457 |
| 7,626,509 B2 * | 12/2009 | Dean | 340/691.8 |
| 7,944,365 B2 * | 5/2011 | Walters et al. | 340/660 |
| 7,982,450 B2 * | 7/2011 | Smoot | 324/67 |
| 8,246,910 B2 * | 8/2012 | Dhirani et al. | 422/82.01 |
| 2006/0139032 A1 * | 6/2006 | Kalokitis et al. | 324/457 |
| 2006/0197661 A1 | 9/2006 | Tracy et al. | |
| 2007/0013557 A1 * | 1/2007 | Wang et al. | 340/945 |
| 2007/0179737 A1 | 8/2007 | Kalokitis et al. | |
| 2007/0279067 A1 | 12/2007 | Wiswell et al. | |
| 2008/0077336 A1 | 3/2008 | Fernandes | |
| 2009/0195255 A1 * | 8/2009 | Kalokitis et al. | 324/522 |
| 2009/0230945 A1 * | 9/2009 | Smoot | 324/67 |
| 2010/0096266 A1 * | 4/2010 | Kim et al. | 204/451 |
| 2011/0184679 A1 * | 7/2011 | Kalokitis | 702/65 |
| 2011/0254532 A1 * | 10/2011 | Smoot | 324/67 |
| 2011/0308472 A1 * | 12/2011 | Straubhaar | 119/72 |
| 2013/0010110 A1 * | 1/2013 | Kalokitis et al. | 348/143 |
| 2013/0013230 A1 * | 1/2013 | Kalokitis et al. | 702/57 |
| 2013/0015979 A1 * | 1/2013 | Kalokitis et al. | 340/660 |

OTHER PUBLICATIONS

Hoffer, Jim. A new device to detect stray voltage on city streets. (Mar. 8, 2006) Retrieved May 18, 2009 from 7online.com.

Press Release for Dangerous Stray Voltage Electricity on Our Streets and Sidewalks Go Undetected—The Electrified Cover Safeguard Solution. Retrieved from nytimes.com Apr. 12, 2009.

* cited by examiner

SYSTEMS AND METHODS FOR STRAY VOLTAGE DETECTION

CROSS-REFERENCE TO RELATED APPLICATIONS

This application is a continuation in-part of a pending U.S. patent application Ser. No. 12/080,071, filed Mar. 31, 2008, which claims the benefit of U.S. provisional Application No. 60/921,175, filed Mar. 30, 2007 and entitled "Systems and Methods for Stray Voltage Detection," the contents of which are incorporated herein by reference in their entirety.

BACKGROUND

An object carrying an electrical charge has an elevated voltage potential or stray voltage. This can be caused by a variety of situations. In one example, damaged electrical insulation allows electrical alternating current (AC) to energize an object, resulting in stray voltage. Stray voltage is a dangerous and potentially fatal hazard to any person or animal that contacts the charged object.

Stray voltage is currently measured using a voltage meter, such as a digital voltage meter or a multimeter. These devices measure a voltage present on an object relative to ground and require a user to be present to test for stray voltage. However, voltage levels measured using such voltage measuring devices are prone to errors because these devices require direct contact between a charged object and ground which, in most cases, is also energized by the same stray voltage that energizes the charged object. In addition, the stray voltage may be only sporadically present (for example, due to environmental variations causing changes in electrical resistivity).

A user testing for stray voltage using such measuring devices will find a potentially hazardous object to test negative, indicating no stray voltage.

SUMMARY

The invention, in various embodiments, addresses the need for systems, methods, and devices to monitor for stray voltage. More particularly, according to one aspect, the invention provides a sensor to continuously monitor objects that may have the presence of stray voltage without any direct electrical and/or physical contact with the object. In some configurations, a stray voltage detector is provided which monitors objects for stray voltage over specified periods of time each day, week, or month. The stray voltage detector may be mounted on a pole, light post, or other structure, and uses a sensor that is not in direct contact with the object to detect the presence of stray voltage.

According to one aspect of the invention, a method for detecting the presence of stray voltage on an object includes the steps of providing a stray voltage detector and providing a pick-up element, wherein the pick-up element senses the presence of voltage on the object relative to a reference voltage set by the stray voltage detector. In certain embodiments, the pick-up element may be an antenna element. The object may be a conductive object, and the signal may be an electrical signal from the pick-up element. According to one embodiment, the stray voltage detector detects if the stray voltage exceeds a selected threshold value. The stray voltage detector may include a visual or audio indicator to signal the detection of stray voltage. The visual indicator may include one or more lights, which may be of various colors, and may flash. The visual indicator, or any indicator, may remain active even after the stray voltage has dissipated. The indicator may be reset by a user, or it may reset after a period of time has passed. The audio indicator may be a horn, a siren, an alarm, or any other selected audio indicator. In one embodiment, the stray voltage detector includes a wired or wireless network connection, which may alert the responsible party and/or local authorities to the detection of stray voltage. In a further embodiment, voltage measurements and/or voltage measurement changes may be recorded and periodically checked by or sent to a user. The stray voltage detector can save human and animal lives by helping to prevent potential victims from coming into contact with charged objects.

According to another aspect of the invention, a system for detecting stray voltage in a conductive object includes a pick-up element that is not in direct contact with the conductive object and capable of sensing a charge if the conductive object has stray voltage on it; circuitry in electrical communication with the pick-up antenna element and capable of sensing the charge or voltage received via the pick-up antenna element, where the circuitry generates, based on the received charge, an indicator signal representative of whether stray voltage is present in the conductive object; and an indicator for indicating to a user of the system, based on the indicator signal, whether stray voltage is present in the conductive object. In some embodiments, the system includes housing for enclosing the circuitry and a support attached to the housing for mounting the housing on or near the conductive object such that the pick-up antenna element is in close proximity to the conductive object that may have stray voltage on it.

In some embodiments, the conductive object has a cylindrical shape and the support has a substantially hemi-cylindrical shape such that it may be disposed adjacent to the conductive object for mounting the housing on the conductive object. The conductive object may be a metal pole, such as a lamp post of a lamp for lighting a public area. In some embodiments, the support encloses a photodetector for sensing an ambient light level and lamp circuitry in communication with the photodetector for switching a lamp between an on state and an off state according to the sensed ambient light level. A conductive element may be in electrical communication with the pick-up element and the circuitry, for transmitting a charge detected by the pick-up element to the circuitry, where the support has an aperture through which passes the conductive element.

In some embodiments, the circuitry includes a sensor for detecting whether the received charge exceeds a predetermined threshold value, the generated indicator signal indicating a presence of stray voltage when the received charge exceeds the predetermined threshold value. The sensor may be a Hex Schmitt sensor. The circuitry may include a power supply for powering the circuitry, such as solar cells, which may be disposed on an exterior surface of the housing, substantially facing upwards. The power supply may include a power storage device for storing power from a power source, such as a rechargeable battery. In some embodiments, the power supply includes a first power source and a second power source, the second power source for supplying power when the first power source is off. The circuitry may include a photodetector for sensing an ambient light level, the first power source switching between on and off according to the sensed ambient light level. In some embodiments, the circuitry includes a timer for switching the circuitry between an on state and an off state.

The indicator may include an audio indicator for aurally indicating to the user whether stray voltage is present in the conductive object, a network connection for automatically communicating to a remote location whether stray voltage is present in the conductive object, and/or a visual indicator for visually indicating to the user whether stray voltage is present in the conductive object. In some embodiments, the indicator includes an externally visible light, such as a light-emitting diode, that may be either on or flashing when indicating the presence of stray voltage in the conductive object. In some embodiments, the indicator includes a first externally visible light which displays a first color when on and a second externally visible light which displays a second color, different from the first color, when on. In some implementations, the first externally visible light turns on when indicating the presence of stray voltage in the conductive object while the second externally visible light turns on when indicating the absence of stray voltage in the conductive object. A visual indicator may be disposed within the housing, where the housing has at least a portion through which light may pass such that the visual indicator is externally visible.

BRIEF DESCRIPTION OF THE DRAWINGS

The foregoing and other objects and advantages of the invention will be appreciated more fully from the following further description thereof, with reference to the accompanying drawings. These depicted embodiments are to be understood as illustrative of the invention and not as limiting in any way.

DETAILED DESCRIPTION OF THE DRAWINGS

To provide an overall understanding of the invention, certain illustrative embodiments will now be described, including systems, methods and devices for detecting stray voltage. However, it will be understood by one of ordinary skill in the art that the systems and methods described herein can be adapted and modified for other suitable applications and that such other additions and modifications will not depart from the scope hereof.

Figure 1A:
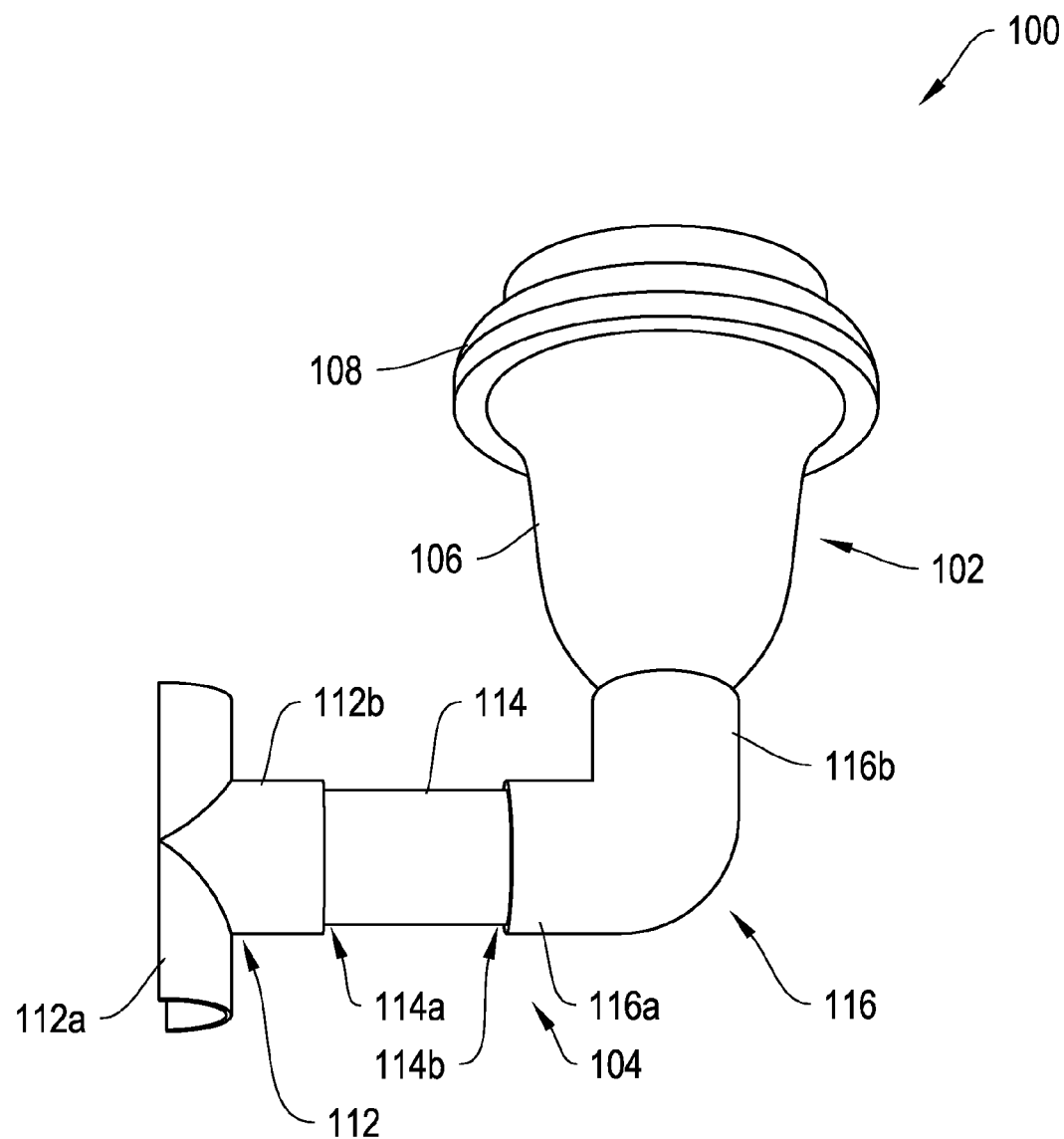
FIGS. 1A and 1B depict a side view and a top angle view, respectively, of an exemplary stray voltage detector, according to one aspect of the invention.
Figure 1B:
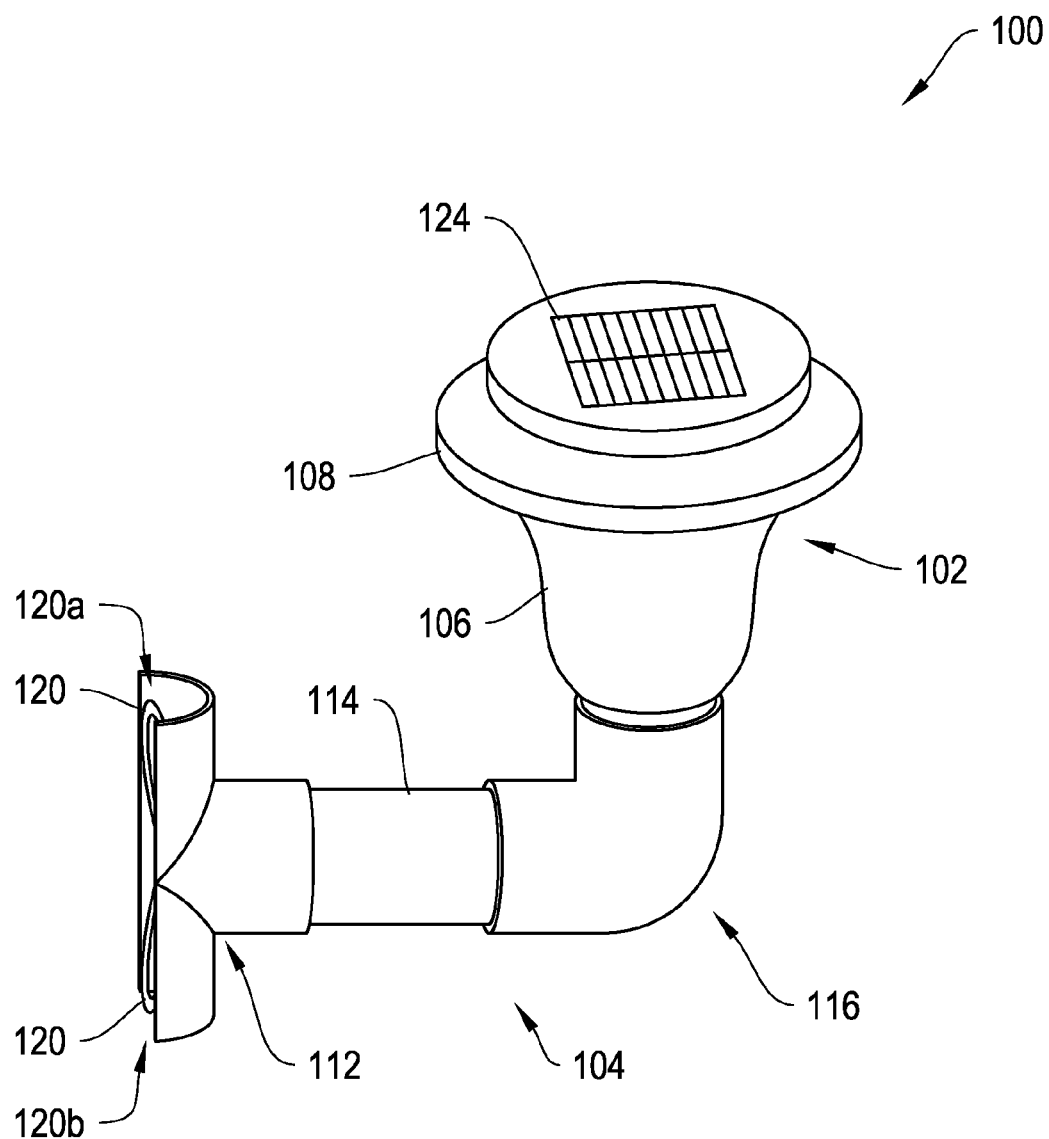

FIGS. 1A and 1B depict a side view and a top angle view, respectively, of an exemplary stray voltage detector 100, according to one aspect of the invention. The detector 100 includes a housing 102, having a body 106 and a lid 108, and a support 104. According to one embodiment, the lid 108 may be removed from the body 106. When the lid 108 is attached to the body 106, the interior of the housing 102 may be substantially sealed, such that exterior environmental matter (for example, dirt and water) is prevented from entering the housing 102. According to one implementation, the stray voltage detector circuitry is housed within the housing 102. In some embodiments, at least a portion of the housing 102, (e.g., the body 106 of the housing 102), may be made of a material that is substantially transparent, translucent, or otherwise allows light to pass through, such that a user viewing the detector 100 may see a light or other visual indicator contained therein.

The support 104 includes first 112, second 114, and third 116 support sections. The support 104 also includes a pick-up element, such as an antenna, which may extend along the length of the support 104. The support 104 may include an aperture extending along its length, and the conductive element may be located within the aperture. The first support section 112 is configured to couple with an object that may have stray voltage. According to one embodiment, the first support section 112 does not make electrical contact with the object. The first support section 112 is T-shaped, having a first 112a and 112b portions, such that the first 112a portion is the T "cross," while the second portion 112b is the T "base." The first portion 112a has a hollowed hemi-cylindrical shape such that it may be coupled with a cylindrical conductive object, for example, a metal pole. The second portion 112b has a cylindrical shape and extends perpendicularly from the exterior (convex) surface of the first portion 112a and couples to a first end 114a of the second support section 114. The second support section 114 is also cylindrically shaped and has a diameter that is less that the diameter of the second portion 112b of the first support section 112, such that it may interfit with the second portion 112b. The third support section 116 is L-shaped and includes first 116a and second 116b leg portions. The first 116a and second 116b leg portions are cylindrically shaped. The first leg portion 116a interfits with a second end 114b of the second support section 114. The second leg portion 116b interfits with the body 106 of the housing 102.

In alternative embodiments, the support 104 may be a single support piece, or it may comprise two, four, five, six, seven, eight or more than eight support sections, or may be any other configuration capable of interfitting with the housing 106 and of attaching to the conductive objective to be monitored for stray voltage. The support 104 may be solid, having no aperture. The support 104 may be composed of a conductive material, or of a non-conductive material. Exemplary materials for the support 104 include metallic and non-metallic materials, plastics, and PVC piping. A coating may be provided on the exterior surface of the support 104, and the coating may be composed of, for example, an insulating material. In some embodiments, the stray voltage detector 100 may include a solar panel 124 (shown in FIG. 1B) and/or a photovoltaic cell for providing power to the voltage detection circuitry. The solar panel 124 is disposed facing substantially upward so as to be exposed to the sun when the stray voltage detector 100 is mounted on the conductive object to be monitored. For example, the solar panel 124 may be coupled to the lid 108 of the housing 102 (as depicted) or disposed on the support 104 or elsewhere on the housing 102.

As shown in FIG. 1B, the stray voltage detector 100 includes a pick-up element 120, which may be an antenna element, (partially shown in FIG. 1B) placed in close proximity to the conductive object to be monitored without being in direct contact with the object. The pick-up element is capable of detecting the charge of the conductive object. In particular, the pick-up antenna element 120 detects a charge if the conductive object has stray voltage and transmits it to the sensor located within the support 104, which then transmits the charge to the interior of the housing 102 (e.g., to stray voltage detector circuitry enclosed within the housing 102).

The pick-up element 120 can take many shapes and may include two circular loops, a straight antenna, or various other configurations. The central point of the pick-up element 120 is attached to the first support section 112, and to a conductive element within the support 104, while first 120a and second 120b ends of the pick-up element 120 protrude from the first support section 112 such that the element 120 is in close proximity of the object to be monitored. In some embodiments, if the first support element 112 is attached to a cylindrical pole, as discussed above, the non-conductive connector 120 will be wedged in close proximately between the cylindrical pole to be monitored and the first support element 112. The pick-up element 120 may be coupled with any selected conductive object, for example, if the first portion 112a of the first support section 112 is coupled with the selected conductive object. Generally, the pick-up element 120 may have a configuration such that when the stray voltage detector 100 is mounted on the conductive object, the pick-up element 120 is in close proximity to, but not in direct contact with, a conductive portion of the conductive object.

In one embodiment, the lid 108 of the housing 102 may include one or more vents, which allow air to flow into the housing 102. In one embodiment, the vents substantially prevent the passage of external environmental material into the housing 102. The vents may prevent the build-up of heat and/or pressure within the housing 102.

Figure 2:
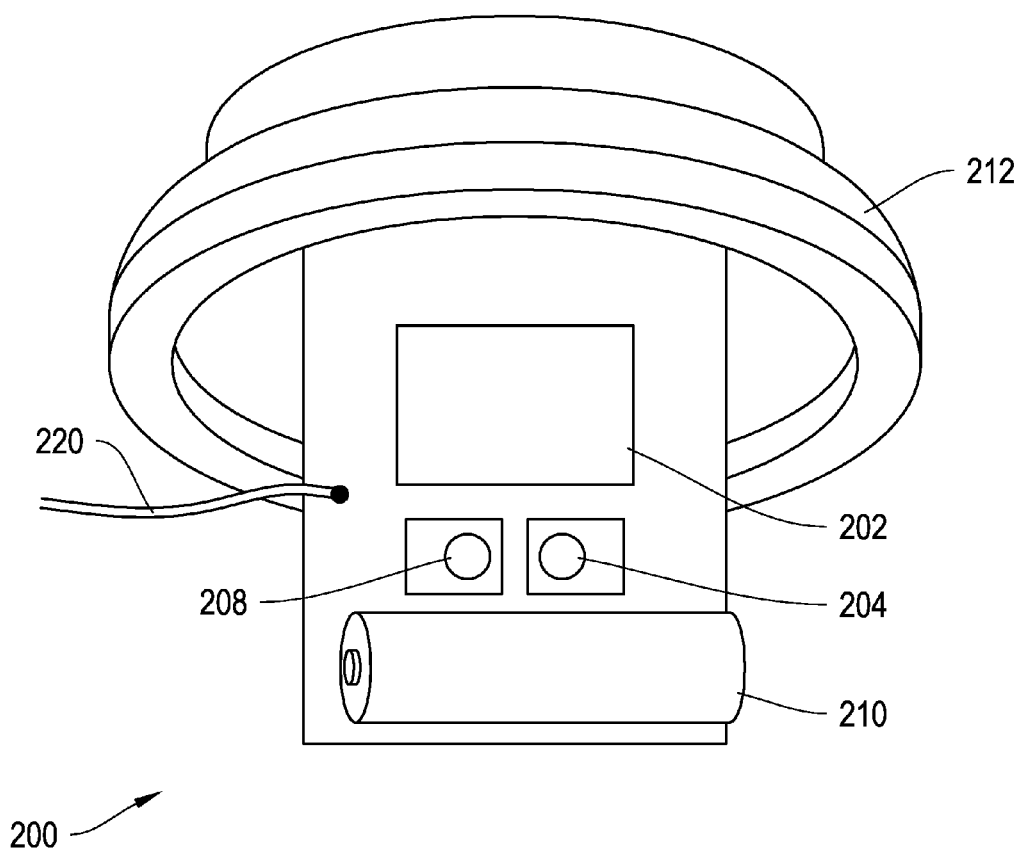
FIG. 2 depicts an exemplary circuit board, which may be part of a stray voltage detector similar to the stray voltage detector depicted in FIGS. 1A and 1B, according to one aspect of the invention.

FIG. 2 depicts an exemplary circuit board 200, which may be part of a stray voltage detector similar to the stray voltage detector depicted in FIGS. 1A and 1B, according to one aspect of the invention. The circuit board 200 may be coupled to a lid 212, similar to the lid 108 of FIGS. 1A and 1B. The circuit board 200 includes circuitry 202 for detecting stray voltage, first and second sensor lights 204 and 208 in communication with the circuitry 202, and a battery 210 for powering the circuitry 202. In one example, the circuitry 202 receives a charge transmitted through a conductive element 220, which is connected to a pick-up element situated in close proximity to the conductive object being monitored for stray voltage. The pick-up element may be similar to the pick-up element 120 of FIGS. 1A and 1B. In response to and based on the received charge, the circuitry 202 may generate an indicator signal, representative of whether stray voltage is present in the conductive object.

The sensor lights 204 and 208 are configured to signal the presence of stray voltage to a user of the stray voltage detector. In particular, the sensor lights 204 and 208 may change states (e.g., turn on, turn off, start flashing, stop flashing) based on the indicator signal. In one embodiment, one of the sensor lights 204 and 208 is red while the other sensor light 204 or 208 is green. The green sensor light 204 or 208 may turn on to indicate that no stray voltage is detected; while the red sensor light 204 or 208 may turn on to indicate the presence of stray voltage. Alternatively, the sensor lights may be any other colors such that light 204 has a different color than light 208. In some embodiments, one or more of the sensor lights 204 and 208 may flash to indicate the detection of stray voltage. For example, the stray voltage detector may have only one sensor light that is on to indicate the absence of stray voltage and flashes to indicate the presence of stray voltage. The sensor lights 204 and 208 may be light-emitting diodes.

Alternatively or in addition, the stray voltage detector may include other indicators for signaling to the user the presence or absence of stray voltage, such as audio indicators or other visual indicators. For example, an audio signal, such as a horn, siren, or alarm, may be sounded to indicate the presence of stray voltage. In some embodiments, the stray voltage detector is configured to alert the user or other selected party when stray voltage is detected. For example, the stray voltage detector may include a wired or wireless network connection, and an alert may be automatically communicated via the network connection to the user or selected party. The alert may be communicated via phone, cell phone, email, radio, or any other communication means. In various examples, the selected party includes one or more of an electrical company and local emergency response authorities, such as police and firemen. In some embodiments, voltage measurements or voltage measurement changes may be recorded and periodically checked by, or sent to, the user or selected party.

The battery 210 provides power for running the circuit board 200. The battery powers the circuitry 202 and may also power the sensor lights 204 and 208. The battery 210 may be a rechargeable battery, and may be coupled to a solar panel, such as the solar panel 124 of FIG. 1B, which uses solar energy to recharge the battery 210. In some examples, the solar panel is coupled to the lid 212, and may be positioned on the top surface of the lid. In other embodiments, the battery 210 may be any selected type of battery or other power source or power storage device, and may include a plurality of batteries. In one example, the battery 210 is a super capacitor.

Figure 3:
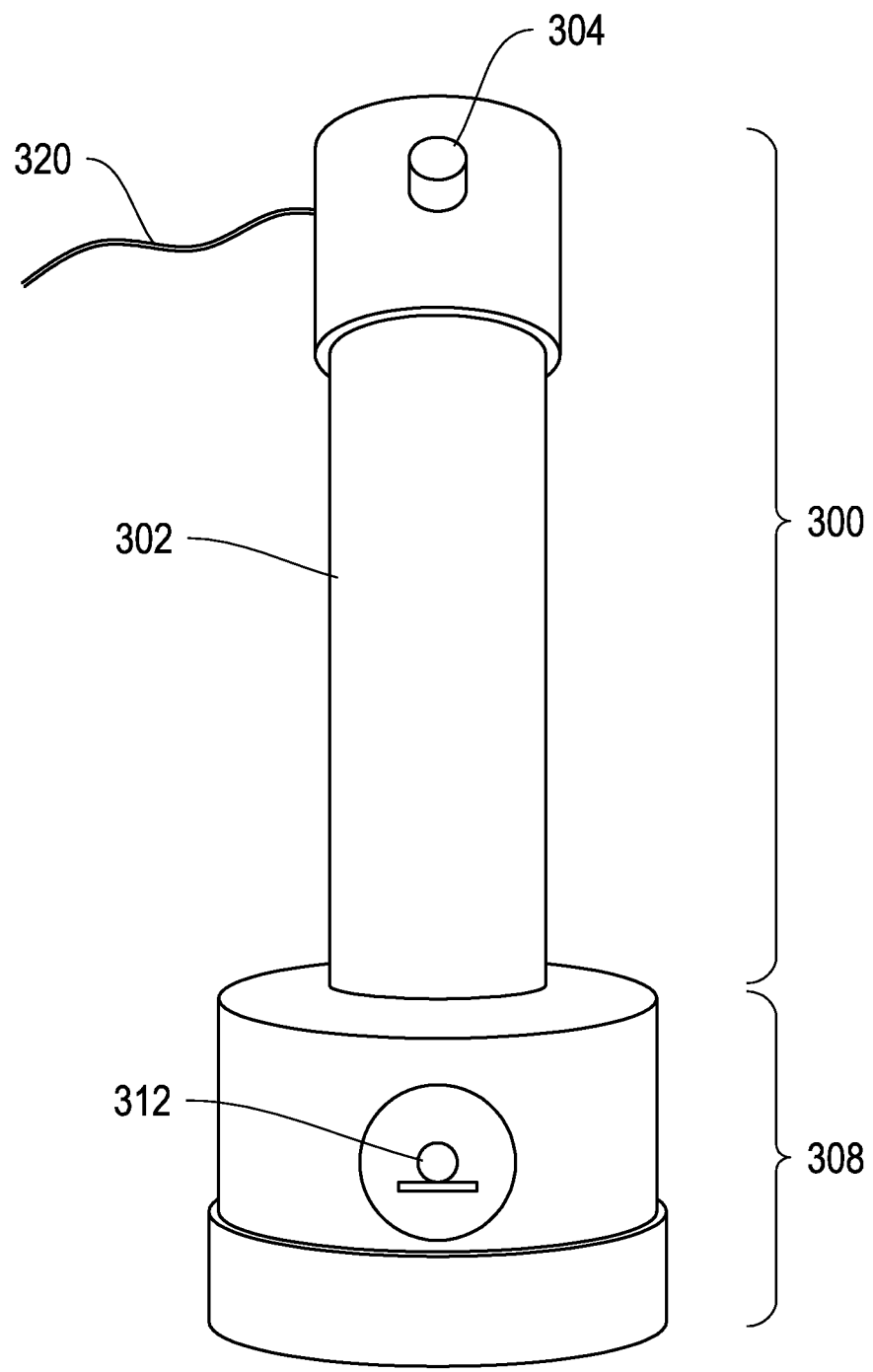
FIG. 3 depicts another exemplary stray voltage detector, according to one aspect of the invention.

FIG. 3 depicts an exemplary stray voltage detector 300, according to one aspect of the invention. The stray voltage detector 300 is attached to a support 308, which may be a conventional street light photodetector, as commonly known in the art, for turning on a street light once the ambient light levels, as detected by a photodetector 312 of the street light photodetector, are sufficiently low. The support 308 may be configured to attach to a street light outlet. Generally, the detector 300 may be configured to couple with a conventional street light photodetector such that the street light photodetector may provide power to the stray voltage detector 300. For example, the power from the street light photodetector may supplement, replace, or alternate with a power source for the stray voltage detector 300, such as solar cells similar to those described above with respect to FIGS. 1A, 1B, and 2. Power received by the detector 300 may be used to power circuitry of the detector 300, similar to the circuitry 202 of FIG. 2, or stored in a power storage device, such as a rechargeable battery.

The stray voltage detector 300 includes a housing 302, a sensor light 304, and a pick-up element 320. The pick-up element 320 is in close contact with the conductive object (e.g., the street light) and capable of carrying a charge transmitted from the conductive object, similar to the pick-up element 120 of FIGS. 1A and 1B. The housing 302 may enclose circuitry, electrical connections, and other components for connecting the detector 300 to components enclosed within the support 308 and for detecting stray voltage based on the charge transmitted via the pick-up element 320. The sensor light 304 may be disposed on the housing 302 and be in communication with the circuitry enclosed therewithin. If such circuitry determines that stray voltage is present in the conductive object, the sensor light 304 may be configured to signal the presence of stray voltage by, for example, flashing, turning on, or turning off.

Figure 4:
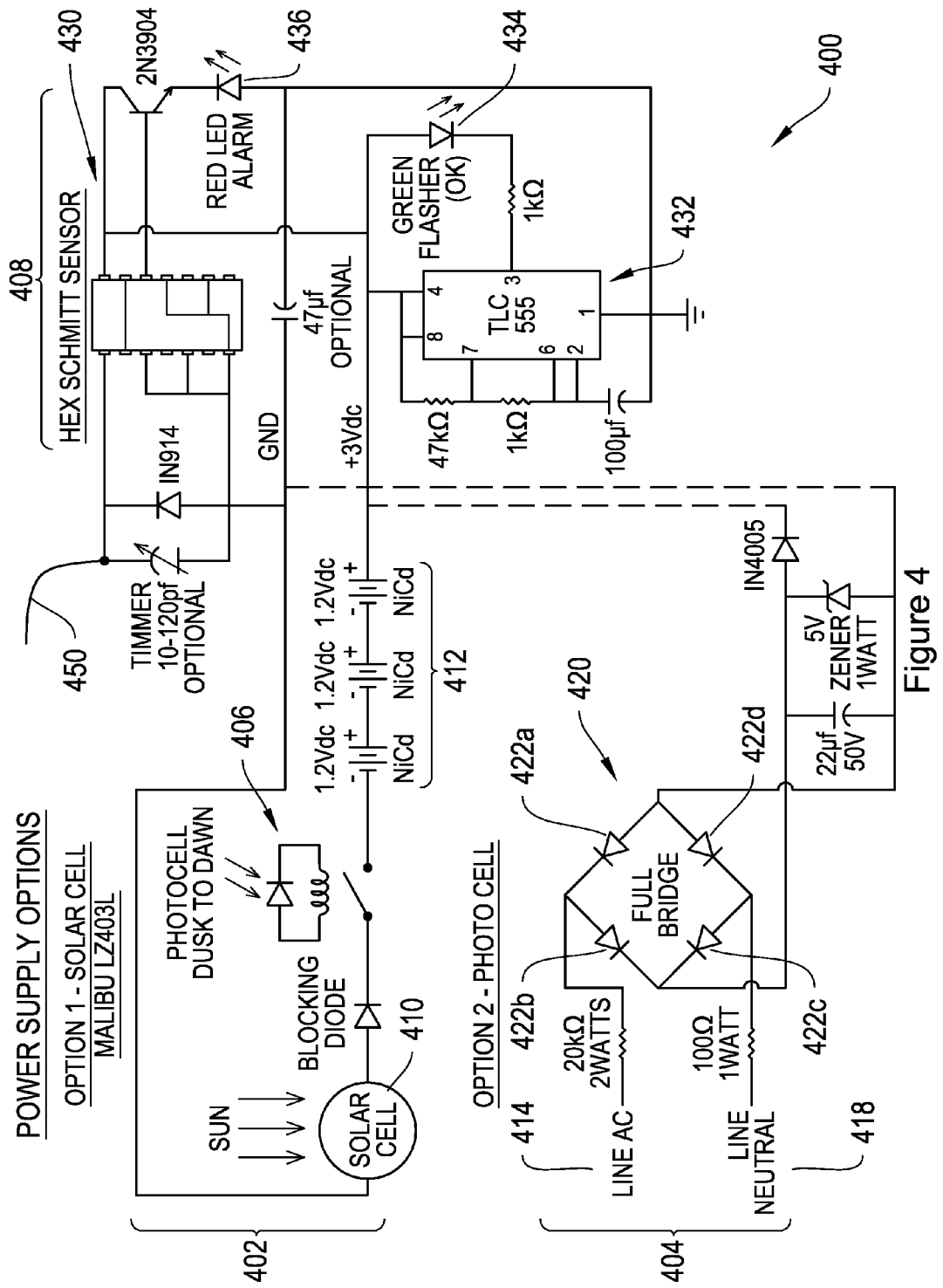
FIG. 4 depicts exemplary stray voltage detector circuitry, which may be part of a stray voltage detector similar to the stray voltage detectors depicted in FIGS. 1A, 1B, or 3, according to one aspect of the invention.

FIG. 4 depicts exemplary stray voltage detector circuitry 400, which may be part of a stray voltage detector similar to the stray voltage detectors depicted in FIGS. 1A, 1B, or 3, according to one aspect of the invention. The stray voltage detector circuitry 400 includes a solar power supply 402, an alternative power supply 404, and a voltage detector 408. The solar power supply 402 includes a solar cell 410 which collects solar energy. The solar energy is stored in one or more Nickel-cadmium batteries 412. A photo cell 406 detects the presence or absence of light, and triggers the solar cell 410 to be used for power when there is sufficient light. When it is too dark to use solar energy to power the stray voltage detector, the photo cell 406 triggers the use of the alternative power from the batteries 412. The alternative power supply 404 may also be used to store power in a rechargeable battery, such as the nickel-cadmium batteries 412, or it may be a power supply from another source, for example, an electrical outlet. The alternative power supply 404 includes an AC input 414, a neutral line 418, and a rectifier 420. The rectifier 420 includes four diodes 422a-422d in a bridge arrangement to provide full-wave rectification of the alternative current (AC) input, thus converting it to direct current (DC).

The voltage detector 408 uses the power supplied by either the solar power supply 402 or the alternative power supply 404. The voltage detector 408 includes a HEX Schmitt sensor 430, a 555 timer 432, a green light 434, and a red light 436 (similar to the sensor lights discussed above with respect to FIGS. 2 and 3). A signal 450 is received via a pick-up element (similar to those discussed above with respect to FIGS. 1A, 1B, 2, and 3), and represents a charge detected in close proximity to the conductive object. The received signal 450 is connected to the input to a sensor 430, which may be a HEX Schmitt sensor, for determining whether stray voltage present in the conductive object corresponds to a voltage level that exceeds a threshold value set in sensor 430. The output from the sensor 430 may cause sensor lights of the voltage detector 408 to turn on, turn off, and/or flash in response to whether the threshold value is exceeded. In some illustrative embodiments, if the input voltage level remains below the threshold value, the 555 timer 432 causes the green light 434 to flash periodically to indicate that no stray voltage has been detected and the unit is operating correctly. If the input voltage level exceeds the threshold value, the output from the sensor 430 causes the red light 436 to light up, signaling the presence of stray voltage. The red light 436 may stay lit while the sensor 430 detects increased voltage levels and, optionally, for a short period of time thereafter. Alternatively, a switch may be added to the stray voltage detector circuitry 400 such that, if the sensor 430 detects an increased voltage level, the red light 436 remains lit until it is reset. In some embodiments, a timer determines when the voltage detector 408 is on and off. For example, the optional timer may cause the voltage detector 408 to run only during the day, or only at night. In another example, the optional timer may cause the voltage detector 408 to run during specified time periods. In yet another example, the timer may be used as a control input for resetting an active indicator after a predefined time period after having detected a stray voltage. Alternatively, a manual reset is used as the control input for resetting an active indicator.

Unlike a multimeter or other existing voltage measuring devices, the pick-up elements as described above in relation to FIGS. 1-4 are antenna elements used to sense stray voltage on a charged object. Such an antenna element is separated from a potentially charged object by an insulating layer, an air gap, or both. When the object gets stray voltage, an electric field emanates from the charged object and induces alternating current in the antenna element. The induced alternating current creates a voltage potential on the antenna element connected to the voltage detector 408. The voltage detector 408 can indicate whether the voltage sensed by the antenna element is a stray voltage in several ways. For example, if a voltage level corresponding to voltage sensed by an antenna element exceeds a threshold value, such as a reference voltage level, e.g., 5 volts, as set in the Hex Schmitt sensor 430, a red light may be switched on to indicate the detection of a stray voltage.

As demonstrated in testing, a voltage detector connected to a four-inch antenna element successfully detected a 5-volt voltage using the implementation described above. It was also demonstrated in testing that lengthening an antenna element improves the sensitivity of the system. Parameters that can affect the choice of the length of an antenna element include, without limitation: the wavelength and magnitude of an electric field of the charged object or the position or distance of an antenna element relative to the charged object. The reference voltage in the Hex Schmitt sensor 430 of the voltage detector 408 can also be specified such that other voltage levels can be detected without substantially re-configuring the voltage detector 408.

Prior art systems that detect stray voltages by determining the potential difference between a charged object and ground are prone to errors. In many cases, the ground is also susceptible to the same stray voltage that energized the object being monitored, reducing, or in some cases preventing entirely, the detection of the stray voltage. The above-described implementation in which the an antenna element is not used to form an electric connection between the charged object and ground, but instead use such an antenna to detect an electric field emanating from an object, is substantially immune from such potential errors.

The foregoing embodiments are merely examples of various configurations of the materials described and disclosed herein. Those skilled in the art will know or be able to ascertain using no more than routine experimentation, many equivalents to the embodiments and practices described herein. Additional configurations which can be readily deduced from the examples set forth herein, including combinations thereof, are included within the scope of the invention.

The invention claimed is:

1. A system for detecting stray voltage in a conductive object, comprising
   a pick-up element separated from the conductive object and capable of detecting an electric field from the conductive object,
   electrical circuitry electrically connected to the pick-up element capable of determining a voltage level corresponding to the electric field detected by the pick-up element, wherein the electrical circuitry generates, based on a comparison of the determined voltage level relative to a reference voltage level, an indicator signal representative of whether stray voltage is present in the conductive object,
   a housing for enclosing the electrical circuitry,
   a support attached to the housing for mounting the housing on or near the conductive object such that the pick-up element remains separated from the conductive object, and
   an indicator for indicating to a user of the system, based on the indicator signal, whether stray voltage is present in the conductive object, wherein the indicator comprises a visual indicator for visually indicating to the user whether stray voltage is present in the conductive object, the visual indicator comprising a first externally visible light which displays a first color when on and a second externally visible light which displays a second color, different from the first color, when on, the first externally visible light turning on when indicating a presence of stray voltage in the conductive object and the second externally visible light turning on when indicating an absence of stray voltage in the conductive object.

2. The system of claim 1, wherein
   the conductive object has a cylindrical shape, and
   the support has a substantially hemi-cylindrical shape such that it is disposed adjacent to the conductive object for mounting the housing on the conductive object.

3. The system of claim 1, wherein the conductive object is a metal pole.

4. The system of claim 3, wherein the conductive object is a lamp post of a lamp for lighting a public area.

5. The system of claim 1, wherein
the conductive object is a lamp for lighting a public area, and
the support encloses a photodetector for sensing an ambient light level and lamp circuitry in communication with the photodetector for switching the lamp between an on state and an off state according to the sensed ambient light level.

6. The system of claim 1, wherein the electrical circuitry comprises a power supply for powering the electrical circuitry.

7. The system of claim 6, wherein the power supply comprises solar cells.

8. The system of claim 7, wherein the solar cells are disposed on an exterior surface of the housing and substantially facing upwards.

9. The system of claim 6, wherein the power supply comprises a first power source and a second power source, the second power source for supplying power when the first power source is off.

10. The system of claim 9, wherein the electrical circuitry comprises a photodetector for sensing an ambient light level, the first power source switching between on and off according to the sensed ambient light level.

11. The system of claim 6, wherein the power supply comprises a power storage device for storing power from a power source.

12. The system of claim 11, wherein the power storage device comprises a rechargeable battery.

13. The system of claim 1, wherein the indicator comprises an audio indicator for aurally indicating to the user whether stray voltage is present in the conductive object.

14. The system of claim 1, wherein the indicator comprises a network connection for automatically communicating to a remote location whether stray voltage is present in the conductive object.

15. The system of claim 1, wherein the first externally visible light comprises a light-emitting diode.

16. The system of claim 1, wherein the first externally visible light is flashing when indicating the presence of stray voltage in the conductive object.

17. The system of claim 1, wherein
the visual indicator is disposed within the housing, and
the housing has at least a portion through which light passes such that the visual indicator is externally visible.

18. The system of claim 1, wherein the electrical circuitry comprises a timer for switching the electrical circuitry between an on state and an off state.

19. The system of claim 1, wherein the pick-up element is separated from the conductive object by at least one of an insulating layer and an air gap.

20. The system of claim 1, wherein the pick-up element is separated from the conductive object by an insulating layer and an air gap.

21. The system of claim 1, wherein the indicator remains on once a stray voltage has been detected and until reset by a control input.

22. The system of claim 21, wherein the control input is generated by one of a timer and a manual reset input.

23. The system of claim 1, wherein the conductive object is a public utility infrastructure object including one of a lamp post, a manhole, and a utility box.

24. The system of claim 1, wherein the pick-up element is an antenna element.

25. A system for detecting stray voltage in a conductive object, comprising
a pick-up element separated from the conductive object and capable of detecting an electric field from the conductive object,
electrical circuitry electrically connected to the pick-up element capable of determining a voltage level corresponding to the electric field detected by the pick-up element, wherein the electrical circuitry generates, based on a comparison of the determined voltage level relative to a reference voltage level, an indicator signal representative of whether stray voltage is present in the conductive object, wherein the electrical circuitry comprises a sensor for detecting whether the determined voltage level exceeds a predetermined threshold value, the generated indicator signal indicating a presence of stray voltage when the determined voltage level exceeds the predetermined threshold value, the sensor comprising a Hex Schmitt sensor,
a housing for enclosing the electrical circuitry,
a support attached to the housing for mounting the housing on or near the conductive object such that the pick-up element remains separated from the conductive object, and
an indicator for indicating to a user of the system, based on the indicator signal, whether stray voltage is present in the conductive object.

* * * * *